US012647202B2

(12) United States Patent
Blankenship et al.

(10) Patent No.: US 12,647,202 B2
(45) Date of Patent: *Jun. 2, 2026

(54) ADAPTATION OF THE CRC CODE LENGTH FOR 3GPP NR

(71) Applicant: Telefonaktiebolaget LM Ericsson (publ), Stockholm (SE)

(72) Inventors: Yufei Blankenship, Kildeer, IL (US); Dennis Hui, Sunnyvale, CA (US); Sara Sandberg, Luleå (SE)

(73) Assignee: Telefonaktiebolaget LM Ericsson (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 18/516,434

(22) Filed: Nov. 21, 2023

(65) Prior Publication Data

US 2024/0089028 A1     Mar. 14, 2024

Related U.S. Application Data

(63) Continuation of application No. 17/487,789, filed on Sep. 28, 2021, now Pat. No. 11,831,428, which is a continuation of application No. 16/250,627, filed on Jan. 17, 2019, now Pat. No. 11,139,915, which is a continuation of application No. PCT/IB2018/051987, filed on Mar. 23, 2018.

(60) Provisional application No. 62/476,497, filed on Mar. 24, 2017.

(51) Int. Cl.
*H03M 13/00* (2006.01)
*H03M 13/09* (2006.01)
(Continued)

(52) U.S. Cl.
CPC .......... *H04L 1/0041* (2013.01); *H03M 13/09* (2013.01); *H03M 13/1102* (2013.01);
(Continued)

(58) Field of Classification Search
None
See application file for complete search history.

(56) References Cited

U.S. PATENT DOCUMENTS 5,844,918 A     12/1998     Kato
8,074,150 B2     12/2011     Buckley
(Continued)

FOREIGN PATENT DOCUMENTS

EP     3588828 A1     1/2020
EP     3711208 B1     8/2023
(Continued)

OTHER PUBLICATIONS

"DraftCR to 38.212 capturing the Jan 18 ad-hoc meeting agreements," Change Request 38.212, CR Draft, Rev Current Version: 15.0.0, R1-1801284, Huawei, 3GPP TSG RAN WG1 Meeting AH 1801, Jan. 22-26, 2018.
(Continued)

*Primary Examiner* — Mujtaba M Chaudry
(74) *Attorney, Agent, or Firm* — Baker Botts L.L.P.

(57) ABSTRACT

According to some embodiments, a method for use in a wireless transmitter comprises: determining an amount of data to transmit; determining a cyclic redundancy check (CRC) polynomial length based on the amount of data to transmit; encoding the data using a CRC of the determined polynomial length; and transmitting the encoded data. According to some embodiments, a method for use in a wireless receiver comprises: receiving encoded data from a wireless transmitter; determining an amount of data received in the encoded data; determining a CRC polynomial length based on the amount of data; and decoding the received encoded data using a CRC of the determined polynomial length. In particular embodiments, the data to transmit comprises control channel data or user data, and the encoding uses Polar codes or low-density parity check (LDPC) codes.

12 Claims, 5 Drawing Sheets

200

| 212 - determine an amount of data to transmit |
| --- |

| 214 - determine a cyclic redundancy check (CRC) polynomial length based on the amount of data to transmit |
| --- |

| 216 - encode the data using a CRC of the determined polynomial length |
| --- |

| 218 - transmit the encoded data |
| --- |

(51) Int. Cl.

| | | |
|---|---|---|
| *H03M 13/11* | (2006.01) | |
| *H03M 13/35* | (2006.01) | |
| *H04L 1/00* | (2006.01) | |

(52) U.S. Cl.
CPC ....... *H03M 13/35* (2013.01); *H03M 13/6516* (2013.01); *H04L 1/0057* (2013.01); *H04L 1/0061* (2013.01)

(56) References Cited

U.S. PATENT DOCUMENTS

| | | | | |
|---|---|---|---|---|
| 2007/0297451 A1* | 12/2007 | Kim | ...................... | H04L 1/0083 |
| | | | | 370/469 |
| 2008/0307288 A1 | 12/2008 | Ziesler | | |
| 2009/0006925 A1 | 1/2009 | Pan | | |
| 2010/0251082 A1* | 9/2010 | Cheng | ................... | H04L 1/0041 |
| | | | | 714/E11.032 |
| 2010/0287441 A1* | 11/2010 | Seo | ...................... | H03M 13/09 |
| | | | | 714/755 |
| 2013/0080862 A1* | 3/2013 | Bennett | ............... | G06F 11/1072 |
| | | | | 714/752 |
| 2013/0145229 A1 | 6/2013 | Frayer | | |
| 2015/0271657 A1 | 9/2015 | Xiong | | |
| 2017/0187491 A1* | 6/2017 | Jang | ..................... | H03M 13/116 |
| 2017/0264316 A1* | 9/2017 | Lee | .................... | H03M 13/1128 |
| 2018/0183465 A1* | 6/2018 | Vivier | ................. | H03M 13/353 |
| 2018/0198894 A1* | 7/2018 | Nammi | ................ | H03M 13/09 |
| 2018/0199331 A1* | 7/2018 | Wang | .................... | H04L 1/0061 |
| 2019/0158219 A1 | 5/2019 | Blankenship et al. | | |
| 2020/0145092 A1* | 5/2020 | Jung | ................... | H04B 7/0413 |
| 2020/0252080 A1* | 8/2020 | Lam | ..................... | H03M 13/112 |
| 2020/0366317 A1* | 11/2020 | Myung | .............. | H03M 13/618 |

FOREIGN PATENT DOCUMENTS

| | | |
|---|---|---|
| JP | 2016119702 A | 6/2016 |
| WO | 2009 053825 A2 | 4/2009 |
| WO | 2016 182378 A1 | 11/2016 |
| WO | 2017 035305 A1 | 3/2017 |

OTHER PUBLICATIONS

"3rd Generation Partnership Project; Technical Specification Group Radio Access Network; NR; Multiplexing and channel coding (Release 15)," 3GPP TS 38.212 V15.0.1 (Feb. 2018).

International Search Report for International application No. PCT/IB2018/051987—Jun. 4, 2018.

Double Bits Error Correction Using CRC Method by Shahram et al.

CRC-16 Polynomials Optimized for Applications Using Self-Synchronous Scramblers by S.S. Gorshe.

Determination of the Best CRC Codes With up to 10-BIT Redundancy by T.S. Baicheva.

EPO, Communication pursuant to Article 94(3) EPC, Application No. 18 720 774.1-1210, Dated: Jan. 8, 2020, 10 pages.

European Patent Office Communication pursuant to Article 94(3) EPC; Appln. No. 18 720 774.1-1210; Dated Jul. 15, 2019; 10 pages.

Japan Patent Office, Notice for Reasons for Rejections in Application No. JP 2019-552258 dated Apr. 19, 2022 (translated).

"Additional CRCs for the Channel Coding," Nortel Networks, TSG-RAN Working Group 1 meeting #4, TSG R1 #4(99) 464, Apr. 18-22, 1999.

"Investigation of LDPC codes with CRC attachment," Ericsson, 3GPP TSG RAN WG1 AH_NR Meeting, R1-1700109, Jan. 16-20, 2017.

"Chairman's Notes of AI 7.4 Channel Coding," Ad-Hoc Chair (Ericsson), 3GPP TSG-RAN WG1 Meeting #91, R1-1711655, Nov. 27-Dec. 1, 2017.

"Simulation results for NR BS Dynamic Range SNR," Huawei, HiSilicon, 3GPP TSG-RAN WG4 Meeting # AH-1802, R4-1800498, Jan. 22-26, 2018.

Office Action from Korean Patent Office in KR Application No. 10-2019-7031412, dated Jul. 11, 2022 (machine English Translation only).

Japan Patent Office, Notice of Reasons for Rejection in JP Application No. 2019-552258 dated Feb. 7, 2023 (not translated).

"Parity-Check polar and CRC-aided polar evaluation," 3GPP TSG RAN WG1 Meeting #88, R1-1701701, Huawei, HiSilicon, Feb. 13-17, 2017.

"Performance evaluation of Polar Codes," 3GPP TSG RAN WG1 Meeting #88, R1-1702849, NTT DOCOMO, Feb. 13-17, 2017.

China Patent Office, Search Report and Office Action in CN 201880033941.1 dated Mar. 13, 2023 (no translation).

Malaysia Intellectual Property Office Substantive Examination Adverse Report (Section 30(2)) in Application No. PI2019005255 dated Aug. 11, 2023.

European Patent Office Communication Pursuant to Article 94(3) EPC Examination Report in EP Application No. 21 166 250.7-1207 dated Jul. 3, 2024.

Japan Patent Office, Office Action in JP Application No. 2023-076578 dated Jun. 20, 2024 (translated).

China Patent Office Decision in CN Application No. 201880033941.1, dated Nov. 20, 2024 (Machine Translation).

Brazilian Patent Office, Official Action dated Jan. 13, 2025, in Brazilian Application No. 112019019812-1 (machine translated).

\* cited by examiner

200

212 - determine an amount of data to transmit

214 - determine a cyclic redundancy check (CRC) polynomial length based on the amount of data to transmit 216 - encode the data using a CRC of the determined polynomial length 218 - transmit the encoded data

250

252 - receive encoded data from a wireless transmitter

254 - determine an amount of data received in the encoded data

256 - determine a CRC polynomial length based on the amount of data

258 - decode the received encoded data using a CRC of the determined polynomial length Determining Module 350

Encoding/Decoding Module 352

Transmitting Module 354

Receiving Module 356

110

Transceiver 310

Processing Circuitry 320

Memory 330

Power Source 340

ADAPTATION OF THE CRC CODE LENGTH FOR 3GPP NR

PRIORITY

This application is a continuation, under 35 U.S.C. § 120, of U.S. patent application Ser. No. 17/487,789 filed on Sep. 28, 2021 which is a continuation under 35 U.S.C. § 120, of U.S. patent application Ser. No. 16/250,627 filed on Jan. 17, 2019, now U.S. Pat. No. 11,139,915, which is a continuation, under 35 U.S.C. § 120 of International Patent Application Serial No. PCT/IB2018/051987 filed Mar. 23, 2018 and entitled "Adaptation of the CRC Code Length for 3GPP NR" which claims priority to U.S. Provisional Patent Application No. 62/476,497 filed Mar. 24, 2017 all of which are hereby incorporated by reference in their entirety.

TECHNICAL FIELD

Particular embodiments are directed to wireless communications and, more particularly, to an adaptive length cyclic redundancy check (CRC) for data transmission.

INTRODUCTION

A Third Generation Partnership Project (3GPP) long term evolution (LTE) network uses a cyclic redundancy check (CRC) for error detection and/or error correction. 3GPP New Radio (NR) may use Polar codes for downlink and uplink control information (DCI, UCI). For example, uplink control information for enhanced mobile broadband (eMBB) may adopt Polar coding, except perhaps for very small block lengths where repetition/block coding may be preferred. Downlink control information for eMBB may adopt Polar coding, except perhaps for very small block lengths where repetition/block coding may be preferred.

UCI parameters for NR may include $N_{max,UCI}=1024$. Code design may be optimized for K up to 200, and that supports values of K up to 500 with good performance, typically using higher code rates.

Thus, UCI of NR may span a wide range, for example, from K=1 bit to K=500 bits. This is much more than the UCI size range of LTE.

In terms of channel coding, CRC code is expected to cover the full size range of UCI for error detection purpose, possibly also for error control purpose. Polar code is expected to cover the full size range of UCI for error control purpose.

The CRC generator polynomial can be selected to be various types depending on the CRC length and the desired code property. Below are two typical types.

Type 1 generator polynomial:
If $g(x)=(x+1)b(x)$, where $b(x)$ is a primitive polynomial of degree L−1, then
Natural code length $N_{CRC1}=2^{L-1}-1$, info length $K_{CRC1}=N_{CRC1}-L=2^{L-1}-L-1$;
The code can detect single, double, triple and any odd number of errors if used with a block length $N \le N_{CRC1}$.
Type 2 generator polynomial:
If $g(x)$ is a primitive polynomial of degree L, then:
Natural code length $N_{CRC2}=2^{L}-1$, info length $K_{CRC2}=N_{CRC2}-L=2^{L}-L-1$
The code can detect any single-bit or double-bit errors if used with a block length $N \le N_{CRC2}$.
If the block length is larger than the natural code length, the minimum distance of the code is 2, since a repeated version of the original cyclic code must be used. The number of weight-2 codewords in a repeated CRC code depends however on both the natural code length and the order of the generator polynomial. The longer the natural code length and the higher the order of the generator polynomial, the fewer weight-2 codewords.

Table 1 shows the natural code length and info length for a set of CRC lengths L, for both type 1 and type 2 generator polynomials.

TABLE 1

| Natural code length and info length for given CRC length L | | | | |
|---|---|---|---|---|
| L | $K_{CRC1}$ | $N_{CRC1}$ | $K_{CRC2}$ | $N_{CRC2}$ |
| 7 | 56 | 63 | 120 | 127 |
| 8 | 119 | 127 | 247 | 255 |
| 9 | 246 | 255 | 502 | 511 |
| 10 | 501 | 511 | 1013 | 1023 |
| 11 | 1012 | 1023 | 2036 | 2047 |
| 12 | 2035 | 2047 | 4083 | 4095 |
| 13 | 4082 | 4095 | 8178 | 8191 |
| 14 | 8177 | 8191 | 16369 | 16383 |
| 15 | 16368 | 16383 | 32752 | 32767 |
| 16 | 32751 | 32767 | 65519 | 65535 |
| 17 | 65518 | 65535 | 131054 | 131071 |
| 18 | 131053 | 131071 | 262125 | 262143 |
| 19 | 262124 | 262143 | 524268 | 524287 |
| 20 | 524267 | 524287 | 1048555 | 1048575 |
| 21 | 1048554 | 1048575 | 2097130 | 2097151 |
| 22 | 2097129 | 2097151 | 4194281 | 4194303 |
| 23 | 4194280 | 4194303 | 8388584 | 8388607 |
| 24 | 8388583 | 8388607 | 16777191 | 16777215 |

A particular problem is that NR UCI can be much larger than that of LTE UCI. The NR UCI size can be as large as 500 bits, or even larger. Existing CRC length of 8 bits, as used for LTE UCI, is not sufficient for NR UCI.

The alternatives described in the Introduction section are not necessarily alternatives that have been previously conceived or pursued. Therefore, unless otherwise indicated herein, the alternatives described in the Introduction section are not prior art and are not admitted to be prior art by inclusion in the Introduction section.

SUMMARY

The embodiments described herein include an adaptive length cyclic redundancy check (CRC) to facilitate the wide range of uplink control information (UCI) size or downlink control information (DCI) size in New Radio (NR).

According to some embodiments, a method for use in a wireless transmitter comprises: determining an amount of data to transmit; determining a cyclic redundancy check (CRC) polynomial length based on the amount of data to transmit; encoding the data using a CRC of the determined polynomial length; and transmitting the encoded data.

In particular embodiments, determining the CRC polynomial length based on the amount of data to transmit comprises: when the determined amount of data to transmit is less than or equal to a threshold number of bits, determining a first CRC polynomial length; and when the determined amount of data to transmit is greater than the threshold number of bits, determining a second CRC polynomial length.

In particular embodiments, the data to transmit comprises control channel data. The control channel data may comprise uplink control information (UCI) or downlink control information (DCI). Encoding the data using the CRC of the determined polynomial length may comprise encoding the data using a Polar code. As one example, the threshold number of bits may be 19 bits, the first CRC polynomial length may be 6, and the second CRC polynomial length may be 11. A portion of the CRC polynomial length may be used for error correction ($L_{corr}$) and another portion of the CRC polynomial length may be used for error detection ($L_{det}$), and wherein $L_{det}$ is 3.

In particular embodiments, the data to transmit comprises user data. The user data may comprise a physical downlink shared channel (PDSCH) or a physical uplink shared channel (PUSCH). Encoding the data using the CRC of the determined polynomial length may comprise encoding the data using a low-density parity check (LDPC) code. As one example, the threshold number of bits may be 3824 bits, the first CRC polynomial length may be 16, and the second CRC polynomial length may be 24.

In particular embodiments, the method further comprises applying a scaling factor to the determined CRC polynomial length to increase or decrease the determined CRC polynomial length based on error detection or error correction requirements. A CRC block length of the CRC may be larger than a natural code length of the CRC. A natural code length of the CRC may include a margin over a block length of the CRC.

According to some embodiments, a wireless transmitter comprises processing circuitry. The processing circuitry is operable to: determine an amount of data to transmit; determine a CRC polynomial length based on the amount of data to transmit; encode the data using the CRC of the determined polynomial length; and transmit the encoded data.

In particular embodiments, the processing circuitry is operable to determine the CRC polynomial length based on the amount of data to transmit by: when the determined amount of data to transmit is less than or equal to a threshold number of bits, determining a first CRC polynomial length; and when the determined amount of data to transmit is greater than the threshold number of bits, determining a second CRC polynomial length.

In particular embodiments, the data to transmit comprises control channel data. The control channel data may comprise UCI or DCI. The processing circuitry may be operable to encode the data using the CRC of the determined polynomial length using a Polar code. As one example, the threshold number of bits may be 19 bits, the first CRC polynomial length may be 6, and the second CRC polynomial length may be 11. A portion of the CRC polynomial length may be used for error correction ($L_{corr}$) and another portion of the CRC polynomial length may be used for error detection ($L_{det}$), and wherein $L_{det}$ is 3.

In particular embodiments, the data to transmit comprises user data. The user data may comprise a PDSCH or a PUSCH. The processing circuitry may be operable to encode the data using the CRC of the determined polynomial length using a LDPC code. As one example, the threshold number of bits may be 3824 bits, the first CRC polynomial length may be 16, and the second CRC polynomial length may be 24.

In particular embodiments, the processing circuitry further operable to apply a scaling factor to the determined CRC polynomial length to increase or decrease the determined CRC polynomial length based on error detection or error correction requirements. A CRC block length of the CRC may be larger than a natural code length of the CRC. A natural code length of the CRC may include a margin over a block length of the CRC.

In particular embodiments, the wireless transmitter comprises a network node or a wireless device.

According to some embodiments, a method for use in a wireless receiver comprises: receiving encoded data from a wireless transmitter; determining an amount of data received in the encoded data; determining a CRC polynomial length based on the amount of data; and decoding the received encoded data using a CRC of the determined polynomial length.

In particular embodiments, determining the CRC polynomial length based on the amount of data received comprises: when the determined amount of data received is less than or equal to a threshold number of bits, determining a first CRC polynomial length; and when the determined amount of data received is greater than the threshold number of bits, determining a second CRC polynomial length.

In particular embodiments, the data received comprises control channel data. The control channel data may comprise UCI or DCI. Decoding the received encoded data using the CRC of the determined polynomial length may comprise decoding the data using a Polar code. As one example, the threshold number of bits may be 19 bits, the first CRC polynomial length may be 6, and the second CRC polynomial length may be 11. A portion of the CRC polynomial length may be used for error correction ($L_{corr}$) and another portion of the CRC polynomial length may be used for error detection ($L_{det}$), and wherein $L_{det}$ is 3.

In particular embodiments, the data received comprises user data. The user data may comprise a PDSCH or a PUSCH. Decoding the received encoded data using the CRC of the determined polynomial length may comprise decoding the received encoded data using a LDPC code. As one example, the threshold number of bits may be 3824 bits, the first CRC polynomial length may be 16, and the second CRC polynomial length may be 24.

In particular embodiments, the method further comprises applying a scaling factor to the determined CRC polynomial length to increase or decrease the determined CRC polynomial length based on error detection or error correction requirements. A CRC block length of the CRC may be larger than a natural code length of the CRC. A natural code length of the CRC may include a margin over a block length of the CRC.

In particular embodiments, the wireless receiver comprises a network node or a wireless device.

According to some embodiments, a wireless receiver comprises processing circuitry. The processing circuitry is operable to: receive encoded data from a wireless transmitter; determine an amount of data received in the encoded data; determine a CRC polynomial length based on the amount of data; and decode the received encoded data using a CRC of the determined polynomial length.

In particular embodiments, the processing circuitry is operable to determine the CRC polynomial length based on the amount of data received by: when the determined amount of data received is less than or equal to a threshold number of bits, determining a first CRC polynomial length; and when the determined amount of data received is greater than the threshold number of bits, determining a second CRC polynomial length.

In particular embodiments, the data received comprises control channel data. The control channel data may comprise UCI or DCI. The processing circuitry may be operable to decode the received encoded data using the CRC of the determined polynomial length using a Polar code. As one example, the threshold number of bits may be 19 bits, the first CRC polynomial length may be 6, and the second CRC polynomial length may be 11. A portion of the CRC polynomial length may be used for error correction ($L_{corr}$) and another portion of the CRC polynomial length is used for error detection ($L_{det}$), and wherein $L_{det}$ is 3.

In particular embodiments, the data received comprises user data. The user data may comprise a PDSCH or a PUSCH. The processing circuitry may be operable to decode the received encoded data using the CRC of the determined polynomial length comprises using a LDPC code. As one example, the threshold number of bits may be 3824 bits, the first CRC polynomial length may be 16, and the second CRC polynomial length may be 24.

In particular embodiments, the processing circuitry further operable to apply a scaling factor to the determined CRC polynomial length to increase or decrease the determined CRC polynomial length based on error detection or error correction requirements. A CRC block length of the CRC may be larger than a natural code length of the CRC. A natural code length of the CRC may include a margin over a block length of the CRC.

In particular embodiments, the wireless transmitter comprises a network node or a wireless device.

According to some embodiments, a wireless transmitter comprises a determining module, an encoding/decoding module, and a transmitting module. The determining module is operable to: determine an amount of data to transmit; and determine a CRC polynomial length based on the amount of data to transmit. The encoding/decoding module is operable to encode the data using the CRC of the determined polynomial length. The transmitting module is operable to transmit the encoded data.

According to some embodiments, a wireless receiver comprises a determining module, an encoding/decoding module, and a receiving module. The receiving module is operable to receive encoded data from a wireless transmitter. The determining module is operable to: determine an amount of data received in the encoded data; and determine a CRC polynomial length based on the amount of data. The encoding/decoding module is operable to decode the received encoded data using a CRC of the determined polynomial length.

Also disclosed is a computer program product. The computer program product comprises instructions stored on non-transient computer-readable media which, when executed by a processor, perform the steps of: determining an amount of data to transmit; determining a CRC polynomial length based on the amount of data to transmit; encoding the data using a CRC of the determined polynomial length; and transmitting the encoded data.

Another computer program product comprises instructions stored on non-transient computer-readable media which, when executed by a processor, perform the steps of: receiving encoded data from a wireless transmitter; determining an amount of data received in the encoded data; determining a CRC polynomial length based on the amount of data; and decoding the received encoded data using a CRC of the determined polynomial length.

Particular embodiments may exhibit some of the following technical advantages. In particular embodiments, adapting the CRC size maintains good error detection capability while using reasonably sized CRC overhead. Alternatively, different levels of error detection capability can also be supported by adapting the CRC size to the application at hand. Other technical advantages will be readily apparent to one skilled in the art from the following figures, description and example claims.

BRIEF DESCRIPTION OF THE DRAWINGS

For a more complete understanding of the embodiments and their features and advantages, reference is now made to the following description, taken in conjunction with the accompanying drawings, in which.

DETAILED DESCRIPTION

Figure 1:
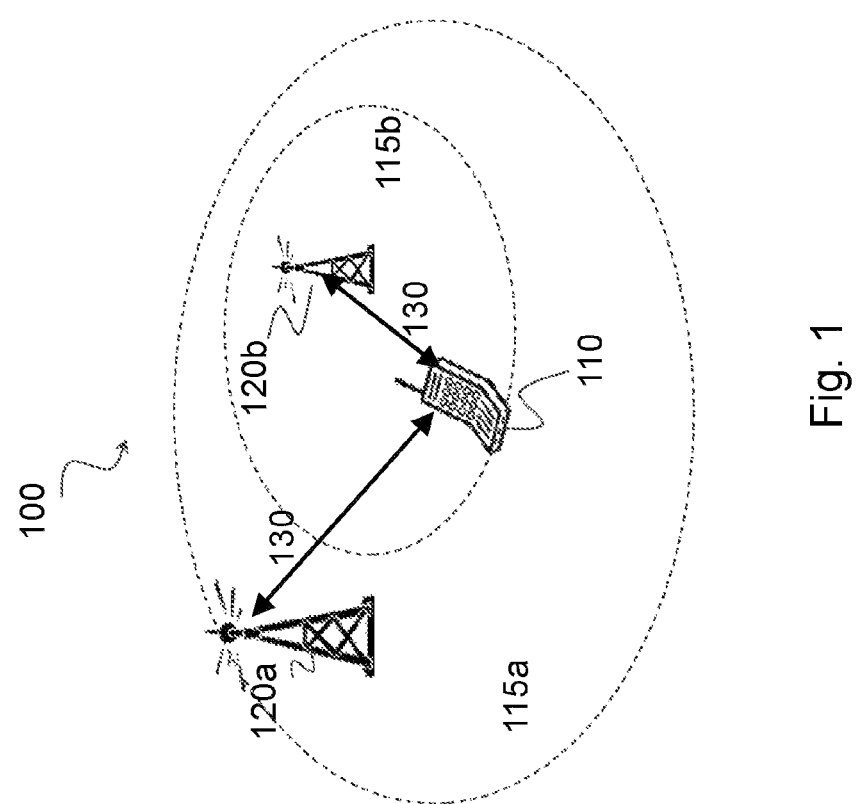
FIG. 1 is a block diagram illustrating an example wireless network, according to some embodiments.

A Third Generation Partnership Project (3GPP) long term evolution (LTE) network uses a cyclic redundancy check (CRC) for error detection and/or error correction. 3GPP New Radio (NR) may use Polar codes for downlink and uplink control information (DCI, UCI). For example, UCI and DCI for enhanced mobile broadband (eMBB) may adopt Polar coding, except perhaps for very small block lengths where repetition or block coding may be preferred.

Code design for NR may be optimized for K up to 200, and further support values of K up to 500 with good performance, typically using higher code rates. Thus, UCI of NR may span a wide range, for example, from K=1 bit to K=500 bits. This is greater than the LTE UCI size range.

In terms of channel coding, a CRC code is expected to cover the entire size range of UCI for error detection, and possibly also for error control. A Polar code is expected to cover the entire size range of UCI for error control purpose.

A particular problem is that NR UCI can be much larger than that of LTE UCI. The NR UCI size can be as large as 500 bits, or even larger. The existing CRC length of 8 bits, as used for LTE UCI, is not sufficient for NR UCI.

Particular embodiments obviate the problems described above and include an adaptive length CRC to facilitate the wide range UCI size or DCI size in NR. In particular embodiments, adapting the CRC size maintains good error detection capability while using a reasonably sized CRC overhead. Alternatively, different levels of error detection capability can also be supported by adapting the CRC size to the application at hand.

The following description sets forth numerous specific details. It is understood, however, that embodiments may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments, whether or not explicitly described.

Particular embodiments are described with reference to FIGS. 1-4B of the drawings, like numerals being used for like and corresponding parts of the various drawings. LTE and NR are used throughout this disclosure as an example cellular system, but the ideas presented herein may apply to other wireless communication systems as well.

FIG. 1 is a block diagram illustrating an example wireless network, according to a particular embodiment. Wireless network 100 includes one or more wireless devices 110 (such as mobile phones, smart phones, laptop computers, tablet computers, MTC devices, or any other devices that can provide wireless communication) and a plurality of network nodes 120 (such as base stations or eNodeBs). Wireless device 110 may also be referred to as a UE. Network node 120 serves coverage area 115 (also referred to as cell 115).

In general, wireless devices 110 that are within coverage of network node 120 (e.g., within cell 115 served by network node 120) communicate with network node 120 by transmitting and receiving wireless signals 130. For example, wireless devices 110 and network node 120 may communicate wireless signals 130 containing voice traffic, data traffic, and/or control signals. A network node 120 communicating voice traffic, data traffic, and/or control signals to wireless device 110 may be referred to as a serving network node 120 for the wireless device 110. Communication between wireless device 110 and network node 120 may be referred to as cellular communication.

Wireless signals 130 may include both downlink transmissions (from network node 120 to wireless devices 110) and uplink transmissions (from wireless devices 110 to network node 120). Wireless signals 130 may include control channels and user data channels. Wireless signals 130 may include CRCs for error detection and/or correction.

Each network node 120 may have a single transmitter or multiple transmitters for transmitting signals 130 to wireless devices 110. In some embodiments, network node 120 may comprise a multi-input multi-output (MIMO) system. Similarly, each wireless device 110 may have a single receiver or multiple receivers for receiving signals 130 from network nodes 120 or other wireless devices 110.

A wireless transmitter, such as network node 120 or wireless device 110, may transmit wireless signals 130 encoded with CRCs of different length, depending on the amount of data to transmit. In some embodiments, the wireless transmitter may apply a scaling factor when determining the CRC length.

A wireless receiver, such as network node 120 or wireless device 110, may receive wireless signals 130 encoded with CRCs of different length, depending on the amount of data received. In some embodiments, the wireless receiver may apply a scaling factor when determining the CRC length.

In wireless network 100, each network node 120 may use any suitable radio access technology, such as long term evolution (LTE), LTE-Advanced, NR, UMTS, HSPA, GSM, cdma2000, NR, WiMax, WiFi, and/or other suitable radio access technology. Wireless network 100 may include any suitable combination of one or more radio access technologies. For purposes of example, various embodiments may be described within the context of certain radio access technologies. However, the scope of the disclosure is not limited to the examples and other embodiments could use different radio access technologies.

As described above, embodiments of a wireless network may include one or more wireless devices and one or more different types of radio network nodes capable of communicating with the wireless devices. The network may also include any additional elements suitable to support communication between wireless devices or between a wireless device and another communication device (such as a landline telephone). A wireless device may include any suitable combination of hardware and/or software. For example, in particular embodiments, a wireless device, such as wireless device 110, may include the components described with respect to FIG. 4A below. Similarly, a network node may include any suitable combination of hardware and/or software. For example, in particular embodiments, a network node, such as network node 120, may include the components described with respect to FIG. 5A below.

In an NR system, the UCI size K is expected to span a much wider range than UCI of LTE. The minimum size is $K_{min}=1$, and the maximum size $K_{max}$ can be as high as 500 bits or even higher for NR Release 15.

The exact value of $K_{max}$ may evolve as NR systems evolve. For example, if a future NR release adopts a larger number of component carriers, then the UCI size may increase. In another example, if UE monitors and reports a larger number of MIMO layers or beams as a part of channel state information (CSI) report, then the UCI size may increase.

Thus, according to some embodiments, it is desirable that the CRC length should adapt to the UCI size it protects. For a larger UCI size, a longer CRC is used; for a shorter UCI, a shorter UCI is used.

A first group of embodiments uses a CRC vector for error detection only. These embodiments assume that the natural length of the CRC is ($K_{CRC1,L1}$, $N_{CRC1,L1}$), which corresponds to CRC length L1 of CRC size type 1. Type 1 refers to the CRC with $g(x)=(x+1)b(x)$, where $b(x)$ is a primitive polynomial of degree $L-1$, which has a natural code length $N_{CRC1}=2^{L-1}-1$. Note that while a type 1 CRC generator polynomial is assumed in the examples, it is understood by those skilled in the art that type 2 and other types of CRC generator polynomials can be used instead, and the same methodology applies.

In these embodiments, the CRC vector is used for error detection only and is not used for error correction. For example, this is the case when UCI is protected by PC-Polar codes.

For the first ensemble of UCI, let the max UCI size be $K_{UCI,1,max}$, $K_{UCI,1,max}<=K_{CRC1,L1}$, where $K_{CRC1,L1}$ is preferably the smallest value in the $K_{CRC1}$ list that is greater than or equal to $K_{UCI,1,max}$. Then a CRC of length L1 is used for the first ensemble of UCI. For example, the first ensemble has $K_{UCI,1,max}<=100$ bits. Then by looking up Table 1, $K_{CRC1,L1}$ is found to be $K_{CRC1,L1}=119$, and a CRC vector of length L1=8 bits used.

For the second ensemble of UCI, let the max UCI size be $K_{UCI,2,max}$, $K_{UCI,1,max}<K_{UCI,2,max}<=K_{CRC1,L2}$, where $K_{CRC1,L2}$ is preferably the smallest value in the $K_{CRC1}$ list that is greater than or equal to $K_{UCI,2,max}$. Then a CRC of length L2 is used for the second ensemble of UCI, where L2>L1. For example, the second ensemble has $K_{UCI,2,max}<=2000$ bits. Then by looking up Table 1, $K_{CRC1,L2}$ is found to be $K_{CRC1,L2}=2035$, and a CRC of length L2=12 bits is used. The same procedure can be carried out if more ensembles of UCI exist.

A second group of embodiments use a CRC vector for both error correction and error detection. These embodiments also assume that the natural length of CRC is $(K_{CRC1,L1}, N_{CRC1,L1})$, which corresponds to a CRC length L1 of CRC size type 1. The CRC vector is used for both error correction and error detection. For example, this is the case when UCI is protected by CRC-assisted Polar codes. Assume that an equivalent of $L_{corr}$ CRC bits are needed for error correction, and an equivalent of $L_{det}$ CRC bits are needed for error detection. For better code performance, a single CRC, rather than two separate CRC, is desirable. A CRC vector of length$>=(L_{corr}+L_{det})$ is used, and correspondingly, a CRC polynomial of degree$>=(L_{corr}+L_{det})$ is used.

For the first ensemble of UCI, let the max UCI size be $K_{UCI,1,max}$, $K_{UCI,1,max}<=K_{CRC1,L1}$, where $K_{CRC1,L1}$ is preferably the smallest value in the $K_{CRC1}$ list that is greater than or equal to $K_{UCI,1,max}$. Then a CRC of length max(L1, $L_{corr}+L_{det}$) is used for the first ensemble of UCI. For example, the first ensemble has $K_{UCI,1,max}<=100$ bits. Then by looking up Table 1, $K_{CRC1,L1}$ is found to be $K_{CRC1,L1}=119$, with L1=8 bits, and a CRC vector of length max(8, $L_{corr}+L_{det}$) is used.

For the second ensemble of UCI, let the max UCI size be $K_{UCI,2,max}$, $K_{UCI,1,max}<K_{UCI,2,max}<=K_{CRC1,L2}$, where $K_{CRC1,L2}$ is preferably the smallest value in the $K_{CRC1}$ list that is greater than or equal to $K_{UCI,2,max}$. Then a CRC of length max(L2, $L_{corr}+L_{det}$) is used for the second ensemble of UCI. For example, the second ensemble has $K_{UCI,2,max}<=2000$ bits. Then by looking up Table 1, $K_{CRC1,L2}$ is found to be $K_{CRC1,L2}=2035$, with L2=12 bits, and a CRC vector of length max(12, $L_{corr}+L_{det}$) is used. The same procedure can be carried out if more ensembles of UCI exist.

A third group of embodiments uses a CRC block length larger than the natural code length. Using the CRC with a code length that is shorter than or equal to the natural code length of the CRC ensures good error detection capability of the CRC code. In some situations, however, a long code length is used, but the requirements on the error detection capabilities of the CRC code may be relaxed. In such a case, the adaptive CRC length may be selected slightly smaller than the CRC length required to avoid repetition of the CRC code.

For the first ensemble of UCI, where the max UCI size is $K_{UCI,1,max}$, $K_{UCI,1,max} \cdot F<=K_{CRC1,L1}$, then s CRC of length L1 is used for the first ensemble of UCI. F is a scaling factor $0<F<=1$ that should take into account the required error detection properties of the resulting CRC code. For example, the first ensemble has $K_{UCI,1,max}<=100$ bits, and the scaling factor F=0.5, then by looking up Table 1, one can find $K_{CRC1,L1}=56$ that satisfies $100*0.5<56$, thus L1=7, and a CRC vector of length 7 is used.

For the second ensemble of UCI, where the max UCI size is $K_{UCI,2,max}$, $K_{UCI,2,max} \cdot F<=K_{CRC2,L2}$, then a CRC of length L2 is used for the second ensemble of UCI. For example, the second ensemble has $K_{UCI,2,max}<=2000$ bits, and the scaling factor F=0.5, then by looking up Table 1, one can find $K_{CRC1,L2}=1012$ that satisfies $2000*0.5<1012$, thus L2=11, and a CRC vector of length 11 is used. The same procedure can be carried out if more ensembles of UCI exist.

A fourth group of embodiments uses a CRC with a natural code length that yields a variable margin over the block length. Applications may exist where different amounts of error detecting capability are needed for the same block length. To facilitate a different amount of error detection capability, an extra margin is placed in the difference between the natural code length and the block length.

For the first ensemble of UCI, the max UCI size is $K_{UCI,1,max}$, $K_{UCI,1,max}<=K_{CRC1,L1}$, and $K_{CRC1,L1}$ is preferably the smallest value in the $K_{CRC1}$ list that is greater than or equal to $K_{UCI,1,max}$. Then a CRC of length (L1+d1) is used for the first ensemble of UCI, where d1 is an integer that serves as a knob for adjusting the extra error detection capability in the resulting CRC code depending on the application. For example, the first ensemble has $K_{UCI,1,max}<=100$ bits, and the margin of d1=2, then L1=7 is found by looking up Table 1. L1+d1=7+2=9, and a CRC vector of length 9 is used.

For the second ensemble of UCI, the max UCI size is $K_{UCI,2,max}$, $K_{UCI,1,max}<K_{UCI,2,max}<=K_{CRC2,L2}$, and $K_{CRC1,L2}$ is preferably the smallest value in the $K_{CRC1}$ list that is greater than or equal to $K_{UCI,2,max}$. Then a CRC of length (L2+d2) is used for the second ensemble of UCI, where d2 is an integer that serves as a knob for adjusting the extra error detection capability in the resulting CRC code for the second ensemble of UCI. For example, the second ensemble has $K_{UCI,2,max}<=2000$ bits, and the margin of d2=1, then L2=12 is found by looking up Table 1. L2+d2=12+1=13, and a CRC vector of length 13 is used.

In general, margins d1 and d2 may or may not be independent of the UCI size. The same procedure can be carried out if more ensembles of UCI exist.

The allocation of UCI to different ensembles can be according to various system parameters and configurations, including (but not limited to) the following: (a) the number of component carriers in carrier aggregation; (b) the number of MIMO layers the UE is configured to report channel state information for; (c) the number of beams the UE is configured to report channel state information for; and (d) the number of bits in the CSI field according to the quantization levels of a reported value.

While the description above used UCI as an example, the same method can be applied to other types of information transmission, for example, downlink data packets, uplink data packets rather than control information. For example, downlink control information (DCI) rather than UCI. Also, the associated error control coding method can include other code types, for example, LDPC codes rather than Polar codes.

Particular embodiments may include methods in a wireless transmitter and a wireless receiver, such as network node or a wireless device. The examples and embodiments described above may be generally represented by the flowchart in FIGS. 2A and 2B.

Figure 2A:
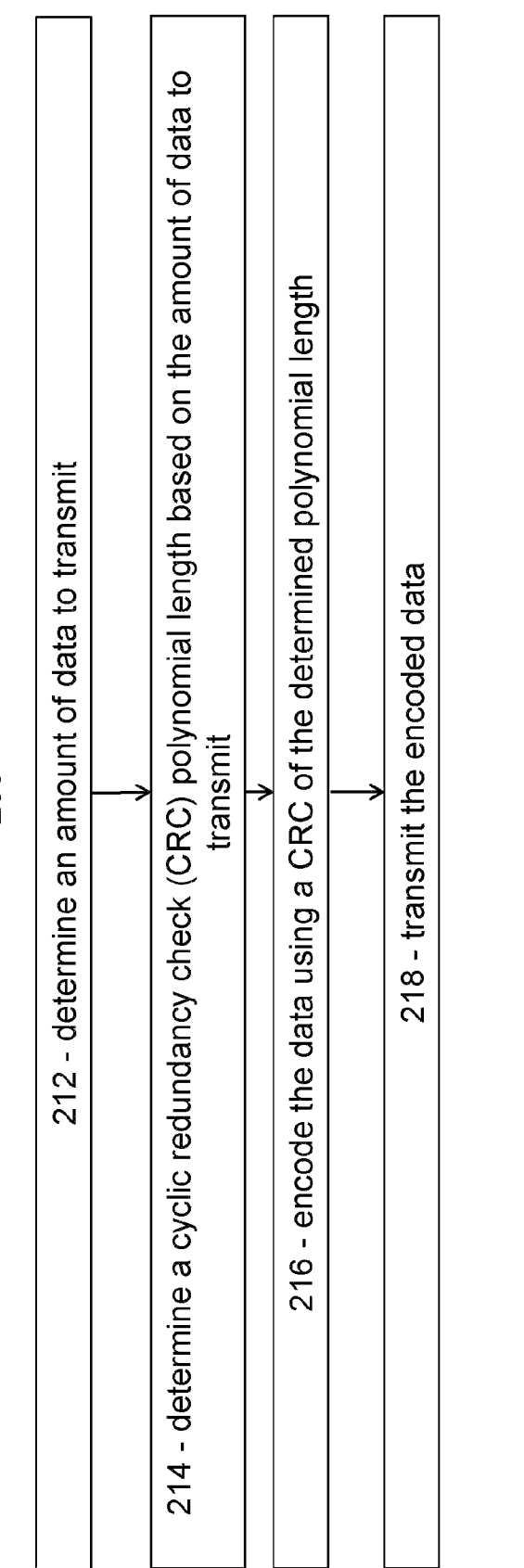
FIG. 2A is a flow diagram illustrating an example method for use in a wireless transmitter, according to some embodiments.

FIG. 2A is a flow diagram illustrating an example method for use in a wireless transmitter, according to some embodiments. In particular embodiments, one or more steps of FIG. 2A may be performed by components of wireless network 100 described with respect to FIG. 1.

The method begins at step 212, where the wireless transmitter determines an amount of data to transmit. For example, network node 120 or wireless device 110 may determine it has 100 bits of data to transmit. In some embodiments, the data to transmit may include control information, such as uplink control information or downlink control information. In some embodiments, the data to transmit may include user data, such as a PDSCH or PUSCH.

At step 214, the wireless transmitter determines a CRC length based on the amount of data to transmit. For example, network node 120 or wireless device 110 may perform a table lookup for a CRC length value associated with the smallest amount of data greater than or equal to the determined amount of data to transmit.

In particular embodiments, when the amount of data to transmit is less than or equal to a threshold number of bits, the wireless transmitter determines a first CRC polynomial length. For example, for transmitting control channel data (e.g., DCI, UCI, etc.) the threshold may be 19 bits. For a number of control channel bits less than or equal to 19 bits, the wireless transmitter may determine a CRC polynomial length of 6. For a number of control channel bits greater than 19 bits, the wireless transmitter may determine a CRC polynomial length of 11. A portion of the CRC polynomial may be used for error correction (e.g., 3 or 9 bits) and a portion may be used for error detection (e.g., 3 bits).

As another example, for transmitting user data (e.g., PDSCH, PUSCH, etc.) the threshold may be 3824 bits. For a number of user data bits less than or equal to 3824 bits, the wireless transmitter may determine a CRC polynomial length of 16. For a number of user data bits greater than 3824 bits, the wireless transmitter may determine a CRC polynomial length of 24. Other embodiments may choose any suitable threshold and any suitable CRC polynomial length.

In some embodiments, the wireless transmitter may apply a scaling factor, such as the scaling factors described above with respect to the third and fourth group of embodiments. A CRC block length of the CRC may be larger than a natural code length of the CRC, or a natural code length of the CRC may include a margin over a block length of the CRC.

At step 216, the wireless transmitter encoded the data using the CRC of the determined length. For example, network node 120 or wireless device 110 may encode the data using an 8 bit CRC or a 12 bit CRC depending on the amount of data to transmit and the values in the lookup table. The wireless transmitter may encode control channel data using Polar codes and user data using LDPC codes.

At step 218, the wireless transmitter transmits the encoded data. For example, network node 120 may transmit the encoded data to wireless device 110, or vice versa.

Modifications, additions, or omissions may be made to method 200. Additionally, one or more steps in method 200 of FIG. 2A may be performed in parallel or in any suitable order. The steps of method 200 may be repeated over time as necessary.

Figure 2B:
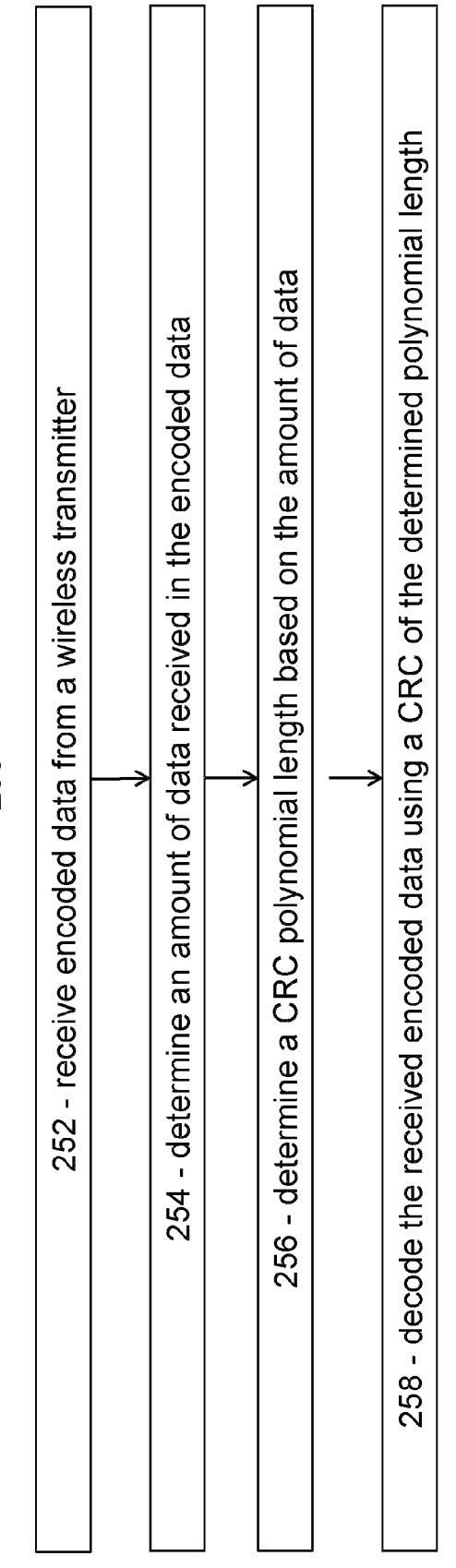
FIG. 2B is a flow diagram illustrating an example method for use in a wireless receiver, according to some embodiments.

FIG. 2B is a flow diagram illustrating an example method for use in a wireless receiver, according to some embodiments. In particular embodiments, one or more steps of FIG. 2B may be performed by components of wireless network 100 described with respect to FIG. 1.

The method begins at step 252, where the wireless receiver receives encoded data from a wireless transmitter. For example, network node 120 may receive the encoded data from wireless device 110, or vice versa.

At step 254, the wireless receiver determines an amount of data received in the encoded data. For example, network node 120 or wireless device 110 may determine it has 100 bits of data received. In some embodiments, the received data may include control information, such as uplink control information or downlink control information. In some embodiments, the received data may include user data, such as a PDSCH or PUSCH.

At step 256, the wireless receiver determines a CRC length based on the amount of received data. For example, network node 120 or wireless device 110 may perform a table lookup for a CRC length value associated with the smallest amount of data greater than or equal to the determined amount of received data.

In particular embodiments, when the amount of received data is less than or equal to a threshold number of bits, the wireless receiver determines a first CRC polynomial length.

For example, for receiving control channel data (e.g., DCI, UCI, etc.) the threshold may be 19 bits. For a number of control channel bits less than or equal to 19 bits, the wireless receiver may determine a CRC polynomial length of 6. For a number of control channel bits greater than 19 bits, the wireless receiver may determine a CRC polynomial length of 11. A portion of the CRC polynomial may be used for error correction (e.g., 3 or 9 bits) and a portion may be used for error detection (e.g., 3 bits).

As another example, for receiving user data (e.g., PDSCH, PUSCH, etc.) the threshold may be 3824 bits. For a number of user data bits less than or equal to 3824 bits, the wireless receiver may determine a CRC polynomial length of 16. For a number of user data bits greater than 3824 bits, the wireless receiver may determine a CRC polynomial length of 24. Other embodiments may choose any suitable threshold and any suitable CRC polynomial length.

In some embodiments, the wireless receiver may apply a scaling factor, such as the scaling factors described above with respect to the third and fourth group of embodiments. A CRC block length of the CRC may be larger than a natural code length of the CRC, or a natural code length of the CRC may include a margin over a block length of the CRC.

At step 258, the wireless receiver decodes the data using the CRC of the determined length. For example, network node 120 or wireless device 110 may decode the data using an 8 bit CRC or a 12 bit CRC depending on the amount of received data and the values in the lookup table. The wireless receiver may decode control channel data using Polar codes and user data using LDPC codes.

Modifications, additions, or omissions may be made to method 250. Additionally, one or more steps in method 250 of FIG. 2B may be performed in parallel or in any suitable order. The steps of method 250 may be repeated over time as necessary.

Figures 3A, 3B:
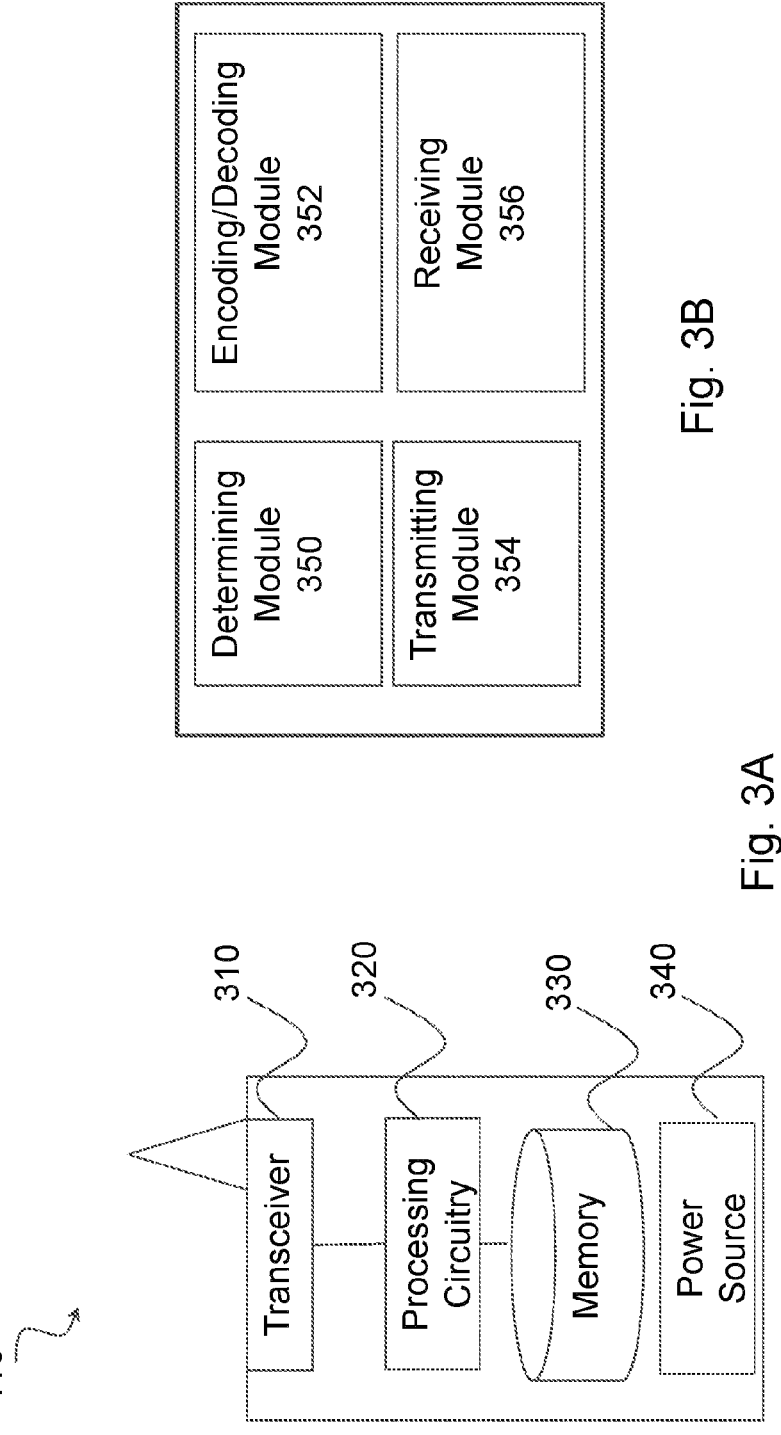
FIG. 3A is a block diagram illustrating an example embodiment of a wireless device.
FIG. 3B is a block diagram illustrating example components of a wireless device.

FIG. 3A is a block diagram illustrating an example embodiment of a wireless device. The wireless device is an example of the wireless devices 110 illustrated in FIG. 1. In particular embodiments, the wireless device is capable of determining a CRC length based on an amount of data to transmit or receive.

Particular examples of a wireless device include a mobile phone, a smart phone, a PDA (Personal Digital Assistant), a portable computer (e.g., laptop, tablet), a sensor, a modem, a machine type (MTC) device/machine to machine (M2M) device, laptop embedded equipment (LEE), laptop mounted equipment (LME), USB dongles, a device-to-device capable device, a vehicle-to-vehicle device, or any other device that can provide wireless communication. The wireless device includes transceiver 310, processing circuitry 320, memory 330, and power source 340. In some embodiments, transceiver 310 facilitates transmitting wireless signals to and receiving wireless signals from wireless network node 120 (e.g., via an antenna), processing circuitry 320 executes instructions to provide some or all of the functionality described herein as provided by the wireless device, and memory 330 stores the instructions executed by processing circuitry 320. Power source 340 supplies electrical power to one or more of the components of wireless device 110, such as transceiver 310, processing circuitry 320, and/or memory 330.

Processing circuitry 320 includes any suitable combination of hardware and software implemented in one or more integrated circuits or modules to execute instructions and manipulate data to perform some or all of the described functions of the wireless device. In some embodiments, processing circuitry 320 may include, for example, one or more computers, one more programmable logic devices, one or more central processing units (CPUs), one or more microprocessors, one or more applications, and/or other logic, and/or any suitable combination of the preceding. Processing circuitry 320 may include analog and/or digital circuitry configured to perform some or all of the described functions of wireless device 110. For example, processing circuitry 320 may include resistors, capacitors, inductors, transistors, diodes, and/or any other suitable circuit components.

Memory 330 is generally operable to store computer executable code and data. Examples of memory 330 include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or or any other volatile or non-volatile, non-transitory computer-readable and/or computer-executable memory devices that store information.

Power source 340 is generally operable to supply electrical power to the components of wireless device 110. Power source 340 may include any suitable type of battery, such as lithium-ion, lithium-air, lithium polymer, nickel cadmium, nickel metal hydride, or any other suitable type of battery for supplying power to a wireless device.

In particular embodiments, processing circuitry 320 in communication with transceiver 310 determines a CRC length based on an amount of data to transmit or receive.

Other embodiments of the wireless device may include additional components (beyond those shown in FIG. 3A) responsible for providing certain aspects of the wireless device's functionality, including any of the functionality described above and/or any additional functionality (including any functionality necessary to support the solution described above).

FIG. 3B is a block diagram illustrating example components of a wireless device 110. The components may include determining module 350, encoding/decoding module 352, transmitting module 354, and receiving module 356.

Determining module 350 may perform the determining functions of wireless device 110. For example, determining module 350 may determine an amount of data to transmit or receive and a CRC length based on the amount of data, according to any of the embodiments and examples described above. In certain embodiments, determining module 350 may include or be included in processing circuitry 320. In particular embodiments, determining module 350 may communicate with encoding/decoding module 352, transmitting module 354, and receiving module 356.

Encoding/decoding module 352 may perform the encoding and/or decoding functions of wireless device 110. For example, encoding/decoding module 352 may encode or decode a data transmission with an adaptive length CRC, according to any of the embodiments and examples described above. In certain embodiments, encoding/decoding module 352 may include or be included in processing circuitry 320. In particular embodiments, encoding/decoding module 352 may communicate with determining module 350, transmitting module 354, and receiving module 356.

Transmitting module 354 may perform the transmitting functions of wireless device 110. For example, transmitting module 354 may transmit data encoded with an adaptive length CRC. In certain embodiments, transmitting module 354 may include or be included in processing circuitry 320. In particular embodiments, transmitting module 354 may communicate with determining module 350 and encoding/decoding module 352.

Receiving module 356 may perform the receiving functions of wireless device 110. For example, receiving module 356 may receive data encoded with an adaptive length CRC. In certain embodiments, receiving module 356 may include or be included in processing circuitry 320. In particular embodiments, receiving module 356 may communicate with determining module 350 and encoding/decoding module 352.

Figure 4B:
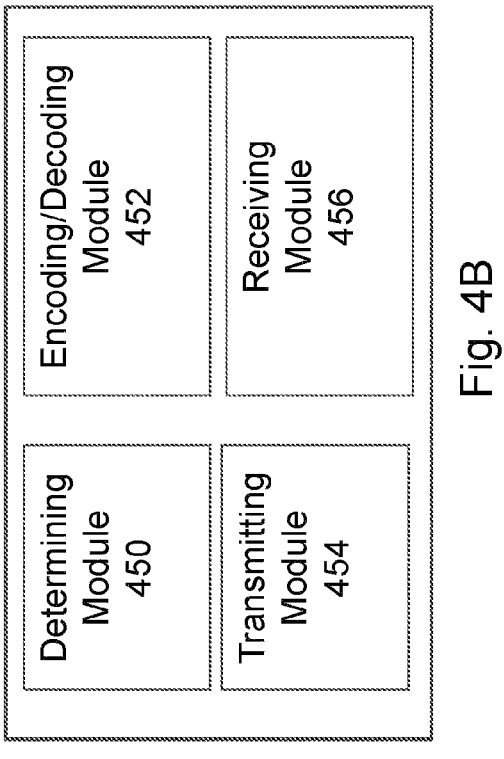
FIG. 4B is a block diagram illustrating example components of a network node.
Figure 4A:
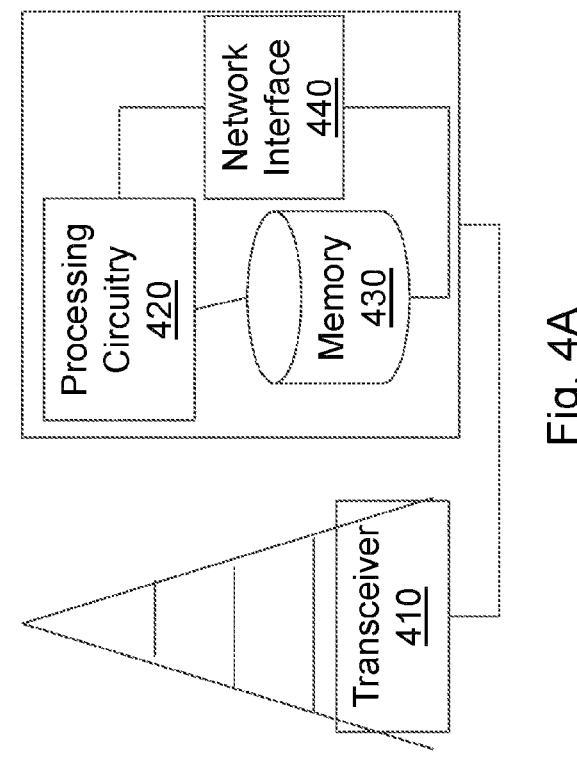
FIG. 4A is a block diagram illustrating an example embodiment of a network node.

FIG. 4A is a block diagram illustrating an example embodiment of a network node. The network node is an example of the network node 120 illustrated in FIG. 1. In particular embodiments, the network node determines a CRC length based on an amount of data to transmit or receive.

Network node 120 can be an eNodeB, a nodeB, a base station, a wireless access point (e.g., a Wi-Fi access point), a low power node, a base transceiver station (BTS), a transmission point or node, a remote RF unit (RRU), a remote radio head (RRH), or other radio access node. The network node includes at least one transceiver 410, processing circuitry 420, at least one memory 430, and at least one network interface 440. Transceiver 410 facilitates transmitting wireless signals to and receiving wireless signals from a wireless device, such as wireless devices 110 (e.g., via an antenna); processing circuitry 420 executes instructions to provide some or all of the functionality described above as being provided by a network node 120; memory 430 stores the instructions executed by processing circuitry 420; and network interface 440 communicates signals to backend network components, such as a gateway, switch, router, Internet, Public Switched Telephone Network (PSTN), controller, and/or other network nodes 120. Processing circuitry 420 and memory 430 can be of the same types as described with respect to processing circuitry 320 and memory 330 of FIG. 3A above.

In some embodiments, network interface 440 is communicatively coupled to processing circuitry 420 and refers to any suitable device operable to receive input for network node 120, send output from network node 120, perform suitable processing of the input or output or both, communicate to other devices, or any combination of the preceding. Network interface 440 includes appropriate hardware (e.g., port, modem, network interface card, etc.) and software, including protocol conversion and data processing capabilities, to communicate through a network.

In particular embodiments, processing circuitry 420 in communication with transceiver 410 determines a CRC length based on an amount of data to transmit or receive.

Other embodiments of network node 120 include additional components (beyond those shown in FIG. 4A) responsible for providing certain aspects of the network node's functionality, including any of the functionality described above and/or any additional functionality (including any functionality necessary to support the solution described above). The various different types of network nodes may include components having the same physical hardware but configured (e.g., via programming) to support different radio access technologies, or may represent partly or entirely different physical components.

FIG. 4B is a block diagram illustrating example components of a network node 120. The components may include determining module 450, encoding/decoding module 452, transmitting module 454, and receiving module 456.

Determining module 450 may perform the determining functions of network node 120. For example, determining module 450 may determine an amount of data to transmit or receive and a CRC length based on the amount of data, according to any of the embodiments and examples described above. In certain embodiments, determining module 450 may include or be included in processing circuitry 420. In particular embodiments, determining module 450 may communicate with encoding/decoding module 452, transmitting module 454, and receiving module 456.

Encoding/decoding module 452 may perform the encoding and/or decoding functions of network node 120. For example, encoding/decoding module 452 may encode or decode a data transmission with an adaptive length CRC, according to any of the embodiments or examples described above. In certain embodiments, encoding/decoding module 452 may include or be included in processing circuitry 420. In particular embodiments, encoding/decoding module 452 may communicate with determining module 450, transmitting module 454, and receiving module 456.

Transmitting module 454 may perform the transmitting functions of network node 120. For example, transmitting module 454 may transmit data encoded with an adaptive length CRC. In certain embodiments, transmitting module 454 may include or be included in processing circuitry 420. In particular embodiments, transmitting module 454 may communicate with determining module 450 and encoding/decoding module 452.

Receiving module 456 may perform the receiving functions of network node 120. For example, receiving module 456 may receive data encoded with an adaptive length CRC. In certain embodiments, receiving module 456 may include or be included in processing circuitry 420. In particular embodiments, receiving module 456 may communicate with determining module 450 and encoding/decoding module 452.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the claims below.

Abbreviations used in the preceding description include:
3GPP Third Generation Partnership Project
BTS Base Transceiver Station
CRC Cyclic Redundancy Check
CSI Channel State Information
CSI-RS Channel State Information Reference Signal
D2D Device to Device
DCI Downlink Control Information
DL Downlink
DMRS Demodulation Reference Signal
eMBB enhanced Mobile Broadband
eNB eNodeB FDD Frequency Division Duplex
LDPC Low-Density Parity Check
LTE Long Term Evolution
M2M Machine to Machine
MIMO Multi-Input Multi-Output
MTC Machine Type Communication
NR New Radio
OFDM Orthogonal Frequency Division Multiplex
PDCCH Physical Downlink Control Channel
PDSCH Physical Downlink Shared Channel
PUCCH Physical Uplink Control Channel
PUSCH Physical Uplink Shared Channel
RAN Radio Access Network
RAR Random Access Response
RAT Radio Access Technology
RBS Radio Base Station
RNC Radio Network Controller
RRC Radio Resource Control
RRH Remote Radio Head
RRU Remote Radio Unit
RS Reference Signal
UCI Uplink Control Information
UE User Equipment
UL Uplink
UTRAN Universal Terrestrial Radio Access Network
WAN Wireless Access Network

The invention claimed is:

1. A method for use in a wireless transmitter, the method comprising:
   determining an amount of data to transmit as control information using at least one of a polar encoder and a low-density parity check (LDPC) encoder, wherein an amount of control information to transmit is larger than a maximum size of control information for long term evolution (LTE);
   when the determined amount of data to transmit is less than or equal to 3824 bits, determining a cyclic redundancy check (CRC) length of 16;
   when the determined amount of data to transmit is greater than 3824 bits, determining the CRC length of 24;
   encoding the data using a CRC of the determined CRC-length; and
   transmitting the encoded data.

2. The method of claim 1, wherein encoding the data using the CRC of the determined CRC length comprises encoding the data using a Polar code.

3. The method of claim 1, wherein a portion of the CRC length is used for error correction ($L_{corr}$) and another portion of the CRC length is used for error detection ($L_{det}$), and wherein $L_{det}$ is 3.

4. The method of claim 1, wherein encoding the data using the CRC of the determined CRC length comprises encoding the data using a low-density parity check (LDPC) code.

5. A wireless transmitter comprising processing circuitry, the processing circuitry operable to:
   determine an amount of data to transmit as control information using at least one of a polar encoder and a low-density parity check (LDPC) encoder, wherein an amount of control information to transmit is larger than a maximum size of control information for long term evolution (LTE);
   when the determined amount of data to transmit is less than or equal to 3824 bits, determine a cyclic redundancy check (CRC) length of 16;
   when the determined amount of data to transmit is greater than 3824 bits, determine the CRC length of 24;

encode the data using the CRC of the determined CRC length; and transmit the encoded data.

6. The wireless transmitter of claim 5, wherein the processing circuitry is operable to encode the data using the CRC of the determined CRC length using a Polar code.

7. The wireless transmitter of claim 5, wherein the processing circuitry is operable to encode the data using the CRC of the determined CRC length using a low-density parity check (LDPC) code.

8. A method for use in a wireless receiver, the method comprising:

receiving encoded data from a wireless transmitter encoded using at least one of a polar encoder and a low-density parity check (LDPC) encoder, wherein the encoded data comprises control information and the amount of control information to receive is larger than a maximum size of control information used in long term evolution (LTE);

determining an amount of data received in the encoded data;

determining a cyclic redundancy check (CRC) length based on the amount of data;

wherein determining the CRC length comprises:

when the determined amount of data to receive is less than or equal to 3824 bits, determining a CRC length of 16;

when the determined amount of data to transmit is greater than 3824 bits, determining the CRC length of 24; and decoding the received encoded data using a CRC of the determined CRC-length.

9. The method of claim 8, wherein decoding the received encoded data using the CRC of the determined CRC length comprises decoding the data using a Polar code.

10. The method of claim 8, wherein a portion of the CRC length is used for error correction ($L_{corr}$) and another portion of the CRC length is used for error detection ($L_{det}$), and wherein $L_{det}$ is 3.

11. The method of claim 8, wherein decoding the received encoded data using the CRC of the determined CRC length comprises decoding the received encoded data using a low-density parity check (LDPC) code.

12. The method of claim 8, wherein a CRC block length of the CRC is larger than a natural code length of the CRC.

\* \* \* \* \*